(12) United States Patent
Andry et al.

(10) Patent No.: US 9,029,238 B2
(45) Date of Patent: May 12, 2015

(54) ADVANCED HANDLER WAFER BONDING AND DEBONDING

(71) Applicant: International Business Machines Corporation, Armonk, NY (US)

(72) Inventors: Paul S. Andry, Yorktown Heights, NY (US); Russell A. Budd, Yorktown Heights, NY (US); John U. Knickerbocker, Yorktown Heights, NY (US); Robert E. Trzcinski, Yorktown Heights, NY (US); Douglas C. La Tulipe, Jr., Yorktown Heights, NY (US)

(73) Assignee: International Business Machines Corporation, Armonk, NY (US)

(*) Notice: Subject to any disclaimer, the term of this patent is extended or adjusted under 35 U.S.C. 154(b) by 210 days.

(21) Appl. No.: 13/649,458

(22) Filed: Oct. 11, 2012

(65) Prior Publication Data

US 2014/0106473 A1    Apr. 17, 2014

(51) Int. Cl.
| | |
|---|---|
| H01L 21/30 | (2006.01) |
| H01L 21/46 | (2006.01) |
| H01L 23/498 | (2006.01) |
| H01L 29/00 | (2006.01) |
| H01L 21/02 | (2006.01) |
| H01L 21/683 | (2006.01) |
| H01L 21/20 | (2006.01) |

(52) U.S. Cl.
CPC .......... *H01L 23/49827* (2013.01); *H01L 29/00* (2013.01); *H01L 21/02* (2013.01); *H01L 21/6835* (2013.01); *H01L 2221/68318* (2013.01); *H01L 2221/68327* (2013.01); *H01L 2221/6834* (2013.01); *H01L 2221/68381* (2013.01); *H01L 2924/0002* (2013.01); *H01L 21/2007* (2013.01)

(58) Field of Classification Search
USPC .......................................... 438/455, 458, 459
See application file for complete search history.

(56) References Cited

U.S. PATENT DOCUMENTS

| | | | |
|---|---|---|---|
| 7,541,203 B1 * | 6/2009 | Knickerbocker | 438/17 |
| 7,825,007 B2 | 11/2010 | Yamazaki et al. | |
| 8,101,498 B2 | 1/2012 | Pinnington et al. | |
| 2012/0329249 A1 | 12/2012 | Ahn et al. | |
| 2013/0002685 A1 | 1/2013 | Shenoy et al. | |
| 2013/0078767 A1 | 3/2013 | Yim | |
| 2014/0141253 A1 * | 5/2014 | Fujii et al. | 428/411.1 |

FOREIGN PATENT DOCUMENTS

WO    WO 2009/146588    12/2009

OTHER PUBLICATIONS

"Production Proven: Temporary wafer bonding for advanced IC packaging" 3M Electronic Markets Materials Division, Dec. 2009.
International Search Report Dated February 24, 2014.

* cited by examiner

*Primary Examiner* — Thanh Y Tran
(74) *Attorney, Agent, or Firm* — F. Chau & Associates, LLC

(57) ABSTRACT

A method for processing a semiconductor wafer includes applying a release layer to a transparent handler. An adhesive layer, that is distinct from the release layer, is applied between a semiconductor wafer and the transparent handler having the release layer applied thereon. The semiconductor wafer is bonded to the transparent handler using the adhesive layer. The semiconductor wafer is processed while it is bonded to the transparent handler. The release layer is ablated by irradiating the release layer through the transparent handler with a laser. The semiconductor wafer is removed from the transparent handler.

20 Claims, 3 Drawing Sheets

ADVANCED HANDLER WAFER BONDING AND DEBONDING

TECHNICAL FIELD

The present disclosure relates to wafer debonding and, more specifically, to advanced methods for handler wafer debonding.

DISCUSSION OF THE RELATED ART

Three-dimensional (3D) chip technologies include 3D integrated circuits (IC) and 3D packaging. 3D chip technologies are gaining widespread importance as they allow for greater integration of more complex circuitry with shorter circuit paths allowing for faster performance and reduced energy consumption. In 3D ICs, multiple thin silicon wafer layers are stacked and interconnected vertically to create a single integrated circuit of the entire stack. In 3D packaging, multiple discrete ICs are stacked, interconnected, and packaged together.

Modern techniques for 3D chip technologies, including both 3D ICs and 3D packaging, may utilize through-silicon vias (TSV). A TSV is a vertical interconnect access (VIA) in which a connection passes entirely through a silicon wafer or die. By using TSVs, 3D ICs and 3D packaged ICs may be more tightly integrated as edge wiring and interposer layers are not required.

Temporary wafer bonding/debonding is an important technology for implementing TSVs and 3D silicon structures in general. Bonding is the act of attaching a silicon device wafer, which is to become a layer in a 3D stack, to a substrate or handling wafer so that it can be processed, for example, with wiring, pads, and joining metallurgy, while allowing the wafer to be thinned, for example, to expose the TSV metal of blind vias etched from the top surface.

Debonding is the act of removing the processed silicon device wafer from the substrate or handling wafer so that the processed silicon device wafer may be added to a 3D stack.

Many existing approaches for temporary wafer bonding/debonding involve the use of an adhesive layer placed directly between the silicon device wafer and the handling wafer. When the processing of the silicon device wafer is complete, the silicon device wafer may be released from the handling wafer by various techniques such as by exposing the wafer pair to chemical solvents delivered by perforations in the handler, by mechanical peeling from an edge initiation point or by heating the adhesive so that it may loosen to the point where the silicon device wafer may be removed by sheering.

3M has developed an approach which relies on light-to-heat-conversion (LTHC) whereby bonding is performed using an adhesive layer and a LTHC layer. Debonding is then performed by using an infrared laser to heat up the LTHC layer and thereby loosening or "detackifying" the adhesive to the point where the silicon device wafer may be removed. However, the LTHC layer is dark colored and highly opaque making it difficult to inspect the underlying circuitry prior to removing the silicon device wafer from the handling wafer, which is generally transparent. Moreover, the LTHC approach employs a YAG laser operating at the infrared (IR) wavelength of 1064 nm, which while effective at generating heat in the LTHC layer and greatly diminishing the bonding strength of the adhesive, is not sufficient to fully and completely ablate the interface resulting in effectively zero adhesion.

SUMMARY

A method for processing a semiconductor wafer includes applying a release layer to a transparent handler. An adhesive layer, that is distinct from the release layer, is applied between a semiconductor wafer and the transparent handler having the release layer applied thereon. The semiconductor wafer is bonded to the transparent handler using the adhesive layer. The semiconductor wafer is processed while it is bonded to the transparent handler. The release layer is ablated by irradiating the release layer through the transparent handler with a laser. The semiconductor wafer is removed from the transparent handler.

The release layer may be strongly absorbs a frequency of light radiated from the laser. Light may be radiated from the laser is ultraviolet light. The light radiated from the laser may have a wavelength of approximately 350 to 360 nm. The laser used for ablating the release layer may be a YAG laser or a XeF excimer laser. The adhesive layer may be applied to the semiconductor wafer. The release layer may be cured prior to bonding the semiconductor wafer to the transparent handler with the release layer applied thereto. The adhesive layer may be applied to the release layer. The release layer may be cured prior to applying the adhesive layer.

The laser used for ablating the release layer may be a diode-pumped solid-state (DPSS) laser. The laser used for ablating the release layer may be an excimer laser. The laser used for ablating the release layer may be a relatively low power laser compared to an excimer laser. The relatively low power may be in the range from approximately 5 Watts to 30 Watts. Processing the semiconductor wafer while it is bonded to the transparent handler may include thinning the semiconductor wafer. Processing the semiconductor wafer while it is bonded to the transparent handler may include creating one or more through-silicon via (TSV).

The method may additionally include inspecting the semiconductor wafer through the transparent hander and the release layer after the processing of the semiconductor wafer and prior to ablating the release layer. Repairs may be performed on the semiconductor wafer prior to ablating the release layer when the inspection reveals a correctable defect. The semiconductor wafer may be added to a 3D stack after removing the semiconductor wafer from the transparent handler.

The release layer may be substantially transparent to visible light.

A method for processing a semiconductor wafer includes applying a release layer strongly absorbent of ultraviolet light to a transparent handler and substantially transparent to visible light. An adhesive layer is applied between the release layer and a semiconductor wafer. The semiconductor wafer is bonded to the transparent handler using the adhesive layer. The semiconductor wafer is processed while it is bonded to the transparent handler. The release layer is ablated by irradiating the release layer through the transparent handler with ultraviolet light. The semiconductor wafer is removed from the transparent handler.

The method may additionally include inspecting the semiconductor wafer through the transparent hander and the release layer after the processing of the semiconductor wafer and prior to ablating the release layer and performing repairs on the semiconductor wafer prior to ablating the release layer when the inspection reveals a correctable defect.

A bonded semiconductor wafer includes a transparent handler. A device wafer is bonded to the transparent handler. A release layer, vulnerable to ablation by ultraviolet laser radiation and transparent to visible light, is provided directly on the transparent handler, between the transparent handler and the device wafer. An adhesive layer is interposed between the transparent handler and the device wafer.

The transparent handler may include Borofloat glass. The transparent handler may be substantially transparent to ultraviolet and visible light. The transparent handler may be approximately 650 μm thick. The device wafer may include integrated circuit elements. The device wafer may include one or more through-silicon via (TSV). The device wafer may be a layer for a 3D integrated circuit or 3D package.

The adhesive layer may be TOK A0206. The release layer may include an adhesive. The release layer may include HD3007. The release layer may include cyclohexanone. The release layer may be approximately 6 μm thick. The release layer may strongly absorbs a frequency of light radiated from an ablating laser. The frequency of light radiated from the ablating laser may be approximately 350 to 360 nm.

The power of light radiated from the ablating laser may be approximately 5 to 30 Watts.

The release layer may be vulnerable to ablation by ultraviolet laser radiation. The release layer may be vulnerable to ablation by ultraviolet laser radiation of a power within the range of approximately 5 to 30 Watts.

The transparent handler, the adhesive layer, and the release layer may be configured to permit inspection of the device wafer therethrough.

A bonded semiconductor structure includes a transparent substrate. A semiconductor wafer is bonded to the transparent substrate. A first adhesive layer is interposed between the transparent substrate and the semiconductor substrate. A second adhesive layer, vulnerable to destruction by ultraviolet laser radiation and transparent to visible light, is provided directly on the transparent substrate and between the semiconductor wafer and the transparent substrate.

The second adhesive layer may include HD3007 or cyclohexanone.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE DRAWINGS

Figure 1:
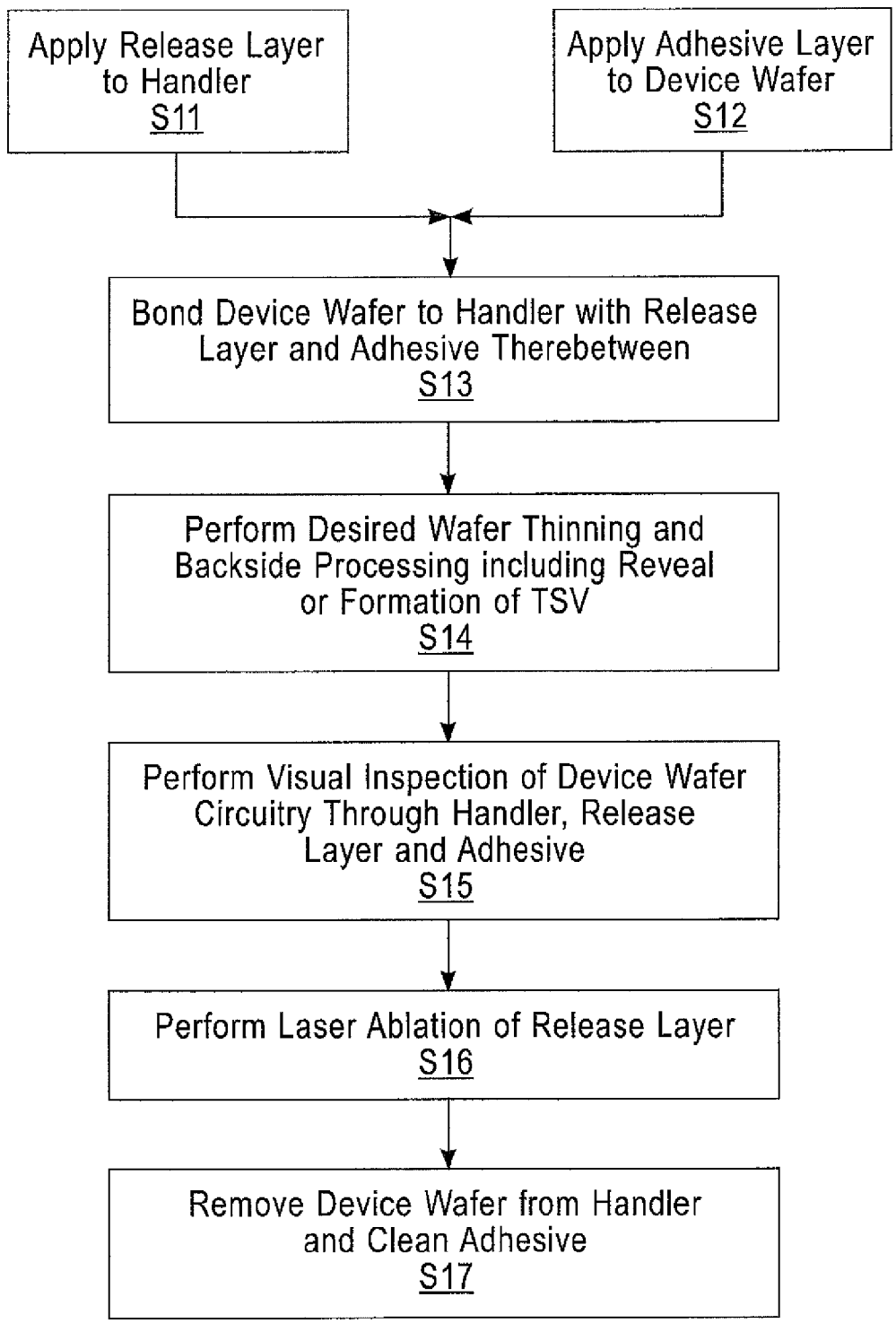
FIG. 1 is a flow chart illustrating an approach for performing handler wafer bonding and debonding in accordance with exemplary embodiments of the present invention.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Exemplary embodiments of the present invention provide various approaches for the temporary bonding and debonding of a silicon device wafer to a handling wafer or other substrate that utilize an adhesive layer and a distinct release layer. The release layer may be transparent so that the underlying circuitry of the silicon device wafer may be optically inspected prior to debonding. Debonding may be performed by ablating the release layer using a laser. The laser used may be an ultraviolet (UV) laser, for example, a 355 nm laser. This wavelength is particularly attractive due to the availability of robust and relatively inexpensive diode-pumped solid-state (DPSS) lasers.

Because the bonding of the silicon device wafer to the handling wafer includes the use of both an adhesive layer and a distinct release layer, the bonding process may be referred to herein as hybrid bonding. According to one approach for hybrid bonding, the release layer may be an ultraviolet (UV) ablation layer and it may be applied to the handling wafer, which may be a glass handler. The UV ablation layer may then be cured. The bonding adhesive that forms the adhesive layer may then be applied to either the glass handler or the silicon device wafer. The UV ablation layer may include a material that is highly absorbing at the wavelength of the laser used in debonding. The material may also be optically transparent in the visible spectrum to allow for inspection of the adhesive bonded interface. Both the UV ablation layer as well as the bonding adhesive are chemically and thermally stable so that they can fully withstand semiconductor processes including heated vacuum depositions including PECVD and metal sputtering, thermal bake steps as well as exposure to wet chemistries including solvents, acids and bases (at the edge bead regions of the bonded wafer interface).

An exemplary glass preparation process may begin with the UV ablation material being applied e.g. by spin coating onto the glass handler. The glass handler with UV ablation material spin-coated thereon may then be soft-baked to remove any solvent. Spin coating parameters may depend on the viscosity of the UV ablation layer, but may fall in the range from approximately 500 rpm to approximately 3000 rpm. The soft-bake may fall in the range from approximately 80° C. to approximately 120° C. The temperature of the final cure may fall in the range from 200° C. to 400° C. Higher cure temperatures may be more effective at ensuring thermal stability of the UV ablation layer during standard CMOS BEOL processing which may take place between 350° C. and 400° C. For strongly UV-absorbing or UV-sensitive materials, very thin final layers on the order of approximately 1000 Å to approximately 2000 Å thick may be sufficient to act as release layers. One such material is Shin Etsu ODL 38 which may be spin applied to glass and cured in a nitrogen environment at 350° C. for approximately 1 hour to produce a film on the order of 1000 Å thick. Such a film may be optically transparent throughout the visible spectrum, but strongly sensitive to decomposition in the UV wavelength range below ~360 nm, and may be fully and cleanly ablated using common UV laser sources such as an excimer laser operating at 308 nm (e.g. XeCl) or 351 nm (e.g. XeF) or a diode-pumped tripled YAG laser operating at 355 nm.

According to exemplary embodiments of the present invention, the bonding adhesive may be any temporary or permanent adhesive desired. The bonding adhesive may be applied to either the glass (e.g., after the UV ablation layer is added) or to the device wafer. Because the UV ablation layer controls the glass release, the adhesive may be chosen irrespective of its UV absorption characteristics. This vastly increases the possible choices. For relatively low-temperature wafer applications (e.g. up to ~250° C.) a wide variety of materials exist (e.g. TOK TZNR-0136) which can be bonded at low pressures and temperatures (<1 atmosphere, approximately 200° C.). A typical bonding cycle for such a material takes place in a bonding tool where the glass and Si wafers are held in alignment but separated by a small gap to allow a vacuum to be created between the wafer and the handler before the two are brought into contact. The wafers are heated to the desired bonding temperature while they are pressed together. Bonding cycles are typically on the order of 3 to 5 minutes. For higher temperature applications (e.g. approximately 300° C. to approximately 350° C.) the adhesive choices are fewer, and include BCB and polyimide-based materials such as HD Microsystems HD3007. These are generally much less viscous once cured, and may be bonded at higher pressures and temperatures (>1 atmosphere, approximately 300° C. to approximately 350° C.). The adhesive chosen may be spin applied at approximately 500 to approximately 3000 rpm, soft-baked at between approximately 80° C. and approximately 120° C. and then cured at between approximately 300° C. and approximately 350° C. for up to an hour in nitrogen. Bonding cycles may be on the order of approximately 20 to approximately 40 minutes for these materials.

Laser debonding to release the glass handler at the ablation later interface may be performed using any one of a number of UV laser sources including excimer lasers operating at 308 nm (e.g. XeCl) or 351 nm (e.g. XeF) as well as diode-pumped (tripled) YAG laser operating at 355 nm or diode-pumped (quadrupled) YAG laser operating at 266 nm. Excimer lasers may be more expensive, may require more maintenance/support systems (e.g. toxic gas containment) and may have generally have very large output powers at low repetition rates (e.g. hundreds of Watts output at several hundred Hz repetition). UV ablation thresholds in the materials specified here may require 100-150 milliJoules per square cm (mJ/sq·cm) to effect release. Due to their large output powers, excimer lasers can supply this energy in a relatively large area beam having dimensions on the order of tens of mm² area (e.g. 0.5 mm×50 mm line beam shape). Due to their large output power and relatively low repetition rate, a laser debonding tool which employs an excimer laser may consist of a movable x-y stage with a fixed beam. Stage movement may be on the order of 10 to 50 mm per second. The wafer pair to be debonded may be placed on the stage, and scanned back and forth until the entire surface had been irradiated.

An alternative laser debonding system may be created using a less expensive, more robust and lower power solid-state pumped tripled YAG laser at 355 nm by rapidly scanning a small spot beam across the wafer surface. The 355 nm wavelength laser may compare favorably to the quadrupled YAG laser at 266 nm for two reasons: 1) Output powers at 355 nm are typically 2 to 3 times larger than at 266 nm for the same sized diode laser pump power, and 2) many common handler wafer glasses (e.g. Schott Borofloat 33) are ~90% or more transmissive at 355 nm but only ~15% transmissive at 266 nm. Since 80% of the power is absorbed in the glass at 266 nm, starting laser powers may be ~6× higher to achieve the same ablation fluence at the release interface, and there is risk of thermal shock in the glass handler itself.

An exemplary 355 nm scanning laser debonding system may include the following: 1) a Q-switched tripled YAG laser with an output power of 5 to 10 Watts at 355 nm, with a repetition rate between 50 and 100 kHz, and pulsewidth of between 10 and 20 ns. The output beam of this laser may be expanded and directed into a commercial 2-axis scanner, comprising mirrors mounted to x and y galvanometer scan motors. The scanner may be mounted a fixed distance above a fixed wafer stage, where the distance would range from 20 cm to 100 cm depending on the working area of the wafer to be released. A distance of 50 to 100 cm may effectively achieve a moving spot speed on the order of 10 meters/second. An F-theta lens may be mounted at the downward facing output of the scanner, and the beam may be focused to spot size on the order of 100 to 500 microns. For a 6 watt output power laser at 355 nm, at 50 kHz repetition and 12 ns pulsewidth, a scanner to wafer distance of 80 cm operating at a raster speed of 10 m/s, the optimal spot size may be on the order of 200 microns, and the required ~100 mJ/sq. cm ablation fluence may be delivered to the entire wafer surface twice in ~30 seconds (for example, using overlapping rows). The use of overlapping rows where the overlap step distance equals half the spot diameter (e.g., 100 microns) may ensure that no part of the wafer is missed due to gaps between scanned rows, and that all parts of the interface see the same total fluence.

FIG. 1 is a flow chart illustrating an approach for performing handler wafer bonding and debonding in accordance with exemplary embodiments of the present invention. First the release layer and the adhesive layer may be applied. According to one exemplary approach, the release layer may be applied to the handler (Step S11) while the adhesive layer may be applied to the device wafer (Step S12). However, according to other exemplary approaches, the release layer may be applied to the handler and then the adhesive layer may be applied to the release layer.

The release layer is always interposed between the glass and the adhesive. Thereafter, the device wafer may be bonded to the handler (Step S13) such that the release layer and the adhesive layer are provided between the device wafer and the handler. The bonding may include a physical bringing together of the device wafer and the handler under controlled heat and pressure in a vacuum environment such as offered in any one of a number of commercial bonding tools.

After the device wafer has been successfully bonded to the handler, desired processing may be performed (Step S14). Processing may include such process steps as patterning, etching, thinning, etc. until the device wafer has achieved its desired state. Thereafter, the circuitry of the device wafer may be inspected (Step S15). Inspection of the device circuitry may be performed to ensure that the device wafer has been properly processed. Inspection may be optically performed, for example, using a high quality microscope or other imaging modality. Optical inspection may be performed though the handler, which, as described above, may be transparent. Optical inspection of the device circuitry may also be performed through the release and adhesive layers as each of these layers may be transparent as well.

Optical inspection may be performed after all processing has been completed and/or at any stage during the processing of the wafer. According to some exemplary embodiments of the present invention, optical inspection may be performed after one or more critical processing steps that are likely to create defects. In the event that optical inspection results in a determination that a defect is present in the device wafer, the device wafer may be rejected on the spot and subsequent processing may be canceled. Because the device wafer may be optically inspected through the handler, removal of the device wafer from the handler is not required to perform testing and accordingly, defects may be detected at an earlier stage in processing than would otherwise be possible. Additionally, waiting until the entire 3D stack has been assembled before performing testing may result in the rejection of the entire 3D stack thereby substantially reducing yield and adding substantially to the cost of manufacture. Moreover, seeing the bonded interface through the glass may be useful in that it may be verified that processing has not generated small voids in the bonding adhesive itself, which can lead to yield loss during thinning and vacuum processing. Because defects such as these may be known to exist at early stages of processing, subsequent processing steps performed on the wafer defective may be avoided.

This opportunity for optically inspecting the device wafer may not be present in prior art approaches such as the 3M light-to-heat-conversion (LTHC) approach discussed above, where the LTHC layer is necessarily opaque in order to be able to generate heat from the infrared laser light exposure.

After inspection and any necessary repair has been performed to the device wafer, a laser ablation process may be performed to sever the device wafer from the handler (Step S16). Laser ablation may be performed by exposing the release layer to UV laser light through the transparent handler. Upon exposure to the UV laser light, the release layer may burn, break down or otherwise decompose. This stands in contrast to the 3M LTHC approach discussed above, where the LTHC layer generates heat as a result of being exposed to the infrared laser light and the heat in turn softens the adhesive layer to the point where the device wafer may be peeled from the handler. Thus, the release layer according to exemplary embodiments of the present invention comprises a material that is broken down under the exposure of the UV laser light. As the adhesive layer may remain hard during this process, the device wafer, along with the adhesive layer, may be easily removed from the handler. Where desired, the remainder of the adhesive layer may be removed from the device wafer using various processing techniques.

Because the release layer burns away during the debonding, the debonding may be substantially cleaner than conventional techniques such as the 3M LTHC approach discussed above.

After the laser ablation has resulted in the severing of the device wafer from the handler, the device wafer may be easily removed from the handler, for example, by simply pulling the handler away, and the device wafer may be cleaned to remove the adhesive (Step S17).

Figure 2:
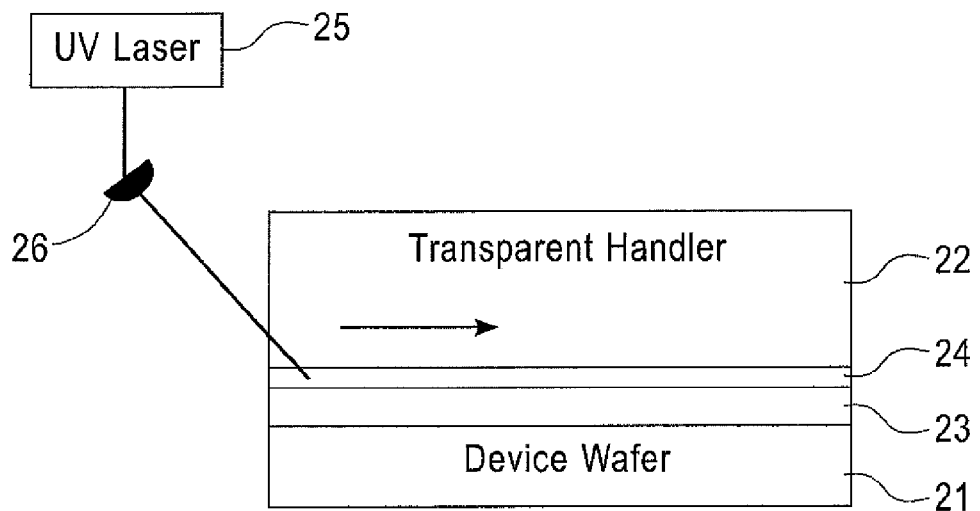
FIG. 2 is a schematic diagram illustrating bonding and debonding of a device wafer to a handler in accordance with exemplary embodiments of the present invention.

FIG. 2 is a schematic diagram illustrating bonding and debonding of a device wafer to a handler in accordance with exemplary embodiments of the present invention. The device wafer 21 may be a silicon wafer that is to be processed, for example, to be added to a 3D stack such as a layer in a 3D IC or an IC to be included in a 3D package. The device wafer 21 may be processed prior to bonding, however, prior to bonding the device wafer 21 may be a full-thickness wafer. The device wafer 21 may be bonded to the handler to provide structural support thereto during subsequent processing which may include a thinning of the device wafer 21 to the point where it may no longer poses the structural integrity necessary to withstand certain processing steps that may have to be performed. The device wafer need not comprise silicon and may instead comprise an alternative semiconductor material. The device wafer 21 may originate as a full-thickness wafer and may subsequently be thinned down to a size of between approximately 200 um and 20 um.

The handler 22 may be a transparent substrate and may comprise, for example, Borofloat glass. The handler may be sufficiently thick to provide structural integrity to the device wafer 21 bonded thereto. For example, the handler may be approximately 650 μm thick.

As described above, the adhesive layer 23 and the release layer 24 may be provided between the device wafer 21 and the handler 22. According to one exemplary embodiment of the present invention, the release layer 24 is disposed directly upon the handler 22. The release layer 24 may comprise a material that is highly specialized to absorb strongly near the UV wavelength of laser light used during laser ablation. As exemplary embodiments of the present invention may employ a UV laser, for example, at or near the wavelength 355 nm, the release layer 24 may comprise a material highly absorbent of UV light, and in particular, light having a 355 nm wavelength. The release layer 24 may itself comprise an adhesive, but at least for reasons discussed below, the release layer 24 may be an entirely distinct layer from the adhesive layer 23.

The release layer 24 may comprise, for example, HD3007, which is a polyimide-based adhesive which may be spin applied and cured at 350° C. The release layer may be approximately 6 μm thick. The thermoplastic nature of HD3007 and similar materials may permit the release layer 24 material to be applied in a liquid state and to flow to fill the surface of the handler 22 during application of the release layer 24. This material may be strong enough to withstand commonly used processing techniques that may subsequently be performed on the device wafer 21 while bonded to the handler 22 without the release layer 24 prematurely breaking down. Such processes may include wafer grinding, application of heat in excess of 260° C., PECVD, CMP, metal sputtering at 200° C., seed metal wet etch, resist strip, and polymer curing at 320° C.

Additionally, while HD3007 may stand up to processing steps such as those described above, it may also strongly absorb UV light and may be easily ablated by radiation from a 308 nm excimer laser.

An example of a more advantageous UV release layer which is not itself an adhesive, but rather an optically planarizing material used as an underlayer in photolithography, is Shin Etsu ODL-38. Very thin layers of this material on the order of 1000 Å may be spin applied to glass handlers and cured at 350° C. in nitrogen. This material absorbs very strongly at UV wavelengths below ~360 nm and decomposes rapidly, and thus is an excellent release layer for use at the 355 nm laser wavelength.

Regardless of the material used, the release layer 24 may comprise a material that can be laser ablated at the UV wavelength of choice. The release layer 24 may be generated, for example, by spin coating or spraying the release layer material, for example, onto the handler, and then curing the material using heat (e.g. 350° C.) and/or UV light. Curing of the release layer material may either be performed prior to bonding of the handler 22 to the device wafer 21 or at the same time.

The adhesive layer 23 may be created by applying an adhesive material to either the device wafer 21 or to the release layer 24. The adhesive layer 23 may comprise a distinct material from that which is used as the release layer 24, and in particular, the adhesive layer 23 may be an adhesive that does not strongly absorb the light of the wavelength that is used to ablate the release layer 24. While any number of suitable adhesives may be used for this layer, one example of a suitable adhesive is TOK A0206. The adhesive layer may be created, for example, by applying the adhesive material to the device wafer 21. The adhesive layer 23 may be cured using heat (e.g. 220° C.).

According to one exemplary embodiment of the present invention, the release layer 24 may be cured prior to performing bonding. In this way, potential adverse interaction between the release layer 24 material and the adhesive layer 23 material may be minimized. Bonding may be performed in a bonder, for example, a Suss bonder using approximately 500 mbar of applied force in a temperature of 220° C. (the curing temperature of the adhesive layer 23 material). In bonding, the device wafer 21 may be bonded, by the adhesive layer 23, to the handler 22 having the release layer 24 attached thereto.

Thereafter, processing, testing, and repair may be performed, for example, as described in detail above. Testing and inspection may be facilitated by the use of a transparent handler such as one made of Borofloat glass.

When the processing, testing and repair is complete, and it is time to debond the device wafer 21 from the handler 22, a laser 25 may be used to irradiate the release layer 24. As discussed above, the laser may be a 308 nm excimer laser or a 355 nm DPSS laser, for example, one created by frequency tripling a diode-laser at 1064 nm. According to one exemplary embodiment of the present invention the laser 25 may be a HIPPO 355QW laser with a wavelength of 355 nm, a power of 5 W at 50 kHz, a repetition rate of 15-300 kHz, and a pulse width of less than 12 ns at 50 kHz. However, other UV lasers may be used such as a HIPPO 266QW having a 266 nm wavelength.

Figures 3A, 3B:
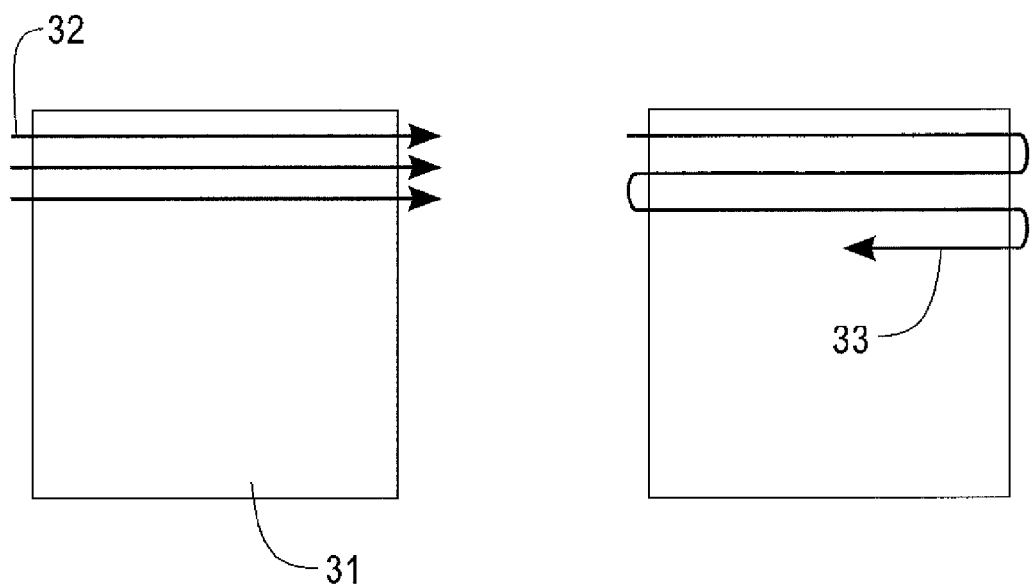
FIGS. 3A and 3B are schematic diagrams illustrating patterns of applying the laser light to a top surface of the handler in accordance with exemplary embodiments of the present invention.

The release layer 24 may be irradiated though the handler 22, which may be transparent, at least to the wavelength of the laser 25 used. The laser 25 may produce a spot beam that is scanned across the surface of the handler 22, for example, in a raster pattern, or the laser 25 may produce a fan beam that is swept once or multiple times across the handler 22. Directing of the light radiated from the laser 25 may be handled by the use of a seamier and lens 26, which may be, for example, an F-Theta scan lens having an 810 mm fl. FIG. 3 is a schematic diagram illustrating pattern of applying the laser light to a top surface 31 of the handler 22 in accordance with exemplary embodiments of the present invention. As seen in FIG. 3A, the laser light may be directed across the top surface 31 of the handler 22 as a spot beam drawn to lines 32 which move along an x-axis direction of the top surface 31 of the handler 22 with each successive line 32 being drawn lower in the y-axis direction. Alternatively, as seen in FIG. 3B, the laser light may be directed in a serpentine pattern 33.

As the UV wavelength of the laser 25 used may contain relatively high energy, the light may efficiently ablate the release layer 24. Once ablated, the device wafer 21 may be freely removed from the handler layer 22. Thereafter, a solvent or cleaning chemical may be used to remove any remaining elements of the adhesive layer 23 and/or release layer 24 that may remain on the device wafer 21. The debonded and cleaned device wafer 21 may then be further processed, diced and applied to a 3D stack and/or joined to a package or another 3D element.

Figure 4:
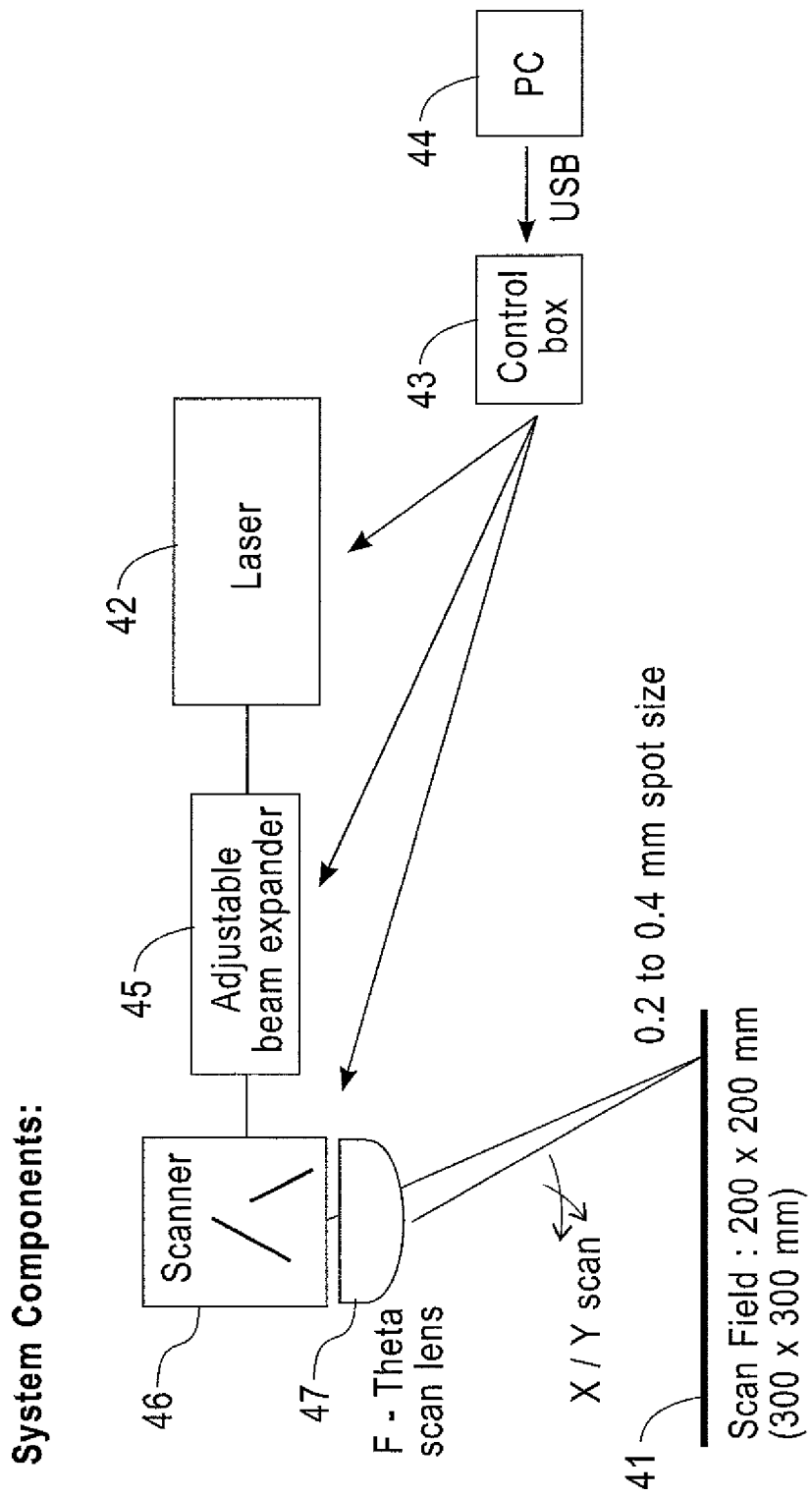
FIG. 4 is a schematic diagram illustrating a scanning laser debonding system in accordance with exemplary embodiments of the present invention.

FIG. 4 is a schematic diagram illustrating an apparatus for performing laser debonding in accordance with exemplary embodiments of the present invention. According to some exemplary embodiments of the present invention, such as is shown here in FIG. 4, the bonded handler and device wafer 41 may remain stationary, for example, on a stage. According to other exemplary embodiments, the stage may be movable. The laser 42 may provide a beam that may then be sent into a beam expander 45 to provide the desired beam size. The beam may then enter a scanner 46 where the beam can be directed along the x and y axes. One or more control units 43 may affect control of the laser 42, beam expander 45 and the scanner 46. Where the stage upon which the bonded handler and wafer 41 are held is movable, the controller 43 may control the movement of the stage as well. In such a case the scanner 46 may be omitted. A computer system 44 may be preprogrammed with the manner of control and these instructions may be executed though the one or more control units 43. A scan lens 47 may adjust the beam so as to strike the bonded handler and device wafer 41 with the desired spot characteristics.

Exemplary embodiments described herein are illustrative, and many variations can be introduced without departing from the spirit of the disclosure or from the scope of the appended claims. For example, elements and/or features of different exemplary embodiments may be combined with each other and/or substituted for each other within the scope of this disclosure and appended claims.

What is claimed is:

1. A method for processing a semiconductor wafer, comprising:
    applying a release layer to a transparent handler that is transparent to visible light;
    applying an adhesive layer, that is distinct from the release layer, between a semiconductor wafer and the transparent handler having the release layer applied thereon;
    bonding the semiconductor wafer to the transparent handler using the adhesive layer;
    processing the semiconductor wafer while it is bonded to the transparent handler;
    visually inspecting the semiconductor wafer through the transparent hander and the release layer after the processing of the semiconductor wafer;
    ablating the release layer by irradiating the release layer through the transparent handler with a laser after visually inspecting the semiconductor wafer though the transparent handler; and
    removing the semiconductor wafer from the transparent handler.

2. The method of claim 1, wherein the release layer strongly absorbs a frequency of light radiated from the laser.

3. The method of claim 1, wherein light radiated from the laser is ultraviolet light.

4. The method of claim 3, wherein the light radiated from the laser has a wavelength of approximately 350 to 360 nm.

5. The method of claim 3, wherein the laser used for ablating the release layer is a YAG laser or a XeF excimer laser.

6. The method of claim 1, wherein the adhesive layer is applied to the semiconductor wafer.

7. The method of claim 6, wherein the release layer is cured prior to bonding the semiconductor wafer to the transparent handler with the release layer applied thereto.

8. The method of claim 1, wherein the adhesive layer is applied to the release layer.

9. The method of claim 8, wherein the release layer is cured prior to applying the adhesive layer.

10. The method of claim 1, wherein the laser used for ablating the release layer is a diode-pumped solid-state (DPSS) laser.

11. The method of claim 1, wherein the laser used for ablating the release layer is an excimer laser.

12. The method of claim 1, wherein the laser used for ablating the release layer is a relatively low power laser compared to an excimer laser.

13. The method of claim 12, wherein the relatively low power is in the range from approximately 5 Watts to 30 Watts.

14. The method of claim 1, wherein processing the semiconductor wafer while it is bonded to the transparent handler includes thinning the semiconductor wafer.

15. The method of claim 1, wherein processing the semiconductor wafer while it is bonded to the transparent handler includes creating one or more through-silicon via (TSV).

16. The method of claim 1, additionally comprising: performing repairs on the semiconductor wafer prior to ablating the release layer when the inspection reveals a correctable defect.

17. The method of claim 16, additionally comprising, adding the semiconductor wafer to a 3D stack after removing the semiconductor wafer from the transparent handler.

18. The method of claim 1, wherein the release layer is substantially transparent to visible light.

19. A method for processing a semiconductor wafer, comprising:

applying a release layer strongly absorbent of ultraviolet light to a transparent handler and substantially transparent to visible light;

applying an adhesive layer between the release layer and a semiconductor wafer;

bonding the semiconductor wafer to the transparent handler that is transparent to visible light using the adhesive layer;

processing the semiconductor wafer while it is bonded to the transparent handler;

visually inspecting the semiconductor wafer through the transparent hander and the release layer after the processing of the semiconductor wafer;

ablating the release layer by irradiating the release layer through the transparent handler with ultraviolet light after visually inspecting the semiconductor wafer though the transparent handler; and removing the semiconductor wafer from the transparent handler.

20. The method of claim 19, additionally comprising: performing repairs on the semiconductor wafer prior to ablating the release layer when the inspection reveals a correctable defect.

* * * * *